(12) United States Patent
Boehm et al.

(10) Patent No.: US 6,560,732 B2
(45) Date of Patent: May 6, 2003

(54) OPERATING METHOD FOR AN INTEGRATED MEMORY HAVING WRITEABLE MEMORY CELLS AND CORRESPONDING INTEGRATED MEMORY

(75) Inventors: Thomas Boehm, Zorneding (DE); Georg Braun, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/963,006

(22) Filed: Sep. 25, 2001

(65) Prior Publication Data

US 2002/0046385 A1 Apr. 18, 2002

Related U.S. Application Data

(63) Continuation of application No. PCT/DE00/00654, filed on Mar. 2, 2000.

(30) Foreign Application Priority Data

Mar. 25, 1999 (DE) .......................... 199 13 570

(51) Int. Cl.$^7$ .......................... G11C 29/00; G11C 7/00
(52) U.S. Cl. .......................... 714/719; 365/201
(58) Field of Search .............................. 714/718, 719; 365/200, 201

(56) References Cited

U.S. PATENT DOCUMENTS

| | | | |
|---|---|---|---|
| 4,752,929 A | * 6/1988 | Kantz et al. | 714/719 |
| 5,402,380 A | * 3/1995 | Kumakura et al. | 365/185.08 |
| 5,428,575 A | 6/1995 | Fudeyasu | 365/201 |
| 5,450,361 A | * 9/1995 | Iwahashi et al. | 365/200 |
| 5,469,394 A | * 11/1995 | Kumakura et al. | 365/201 |
| 5,532,963 A | * 7/1996 | Kushiyama et al. | 365/201 |
| 5,581,198 A | * 12/1996 | Trimberger | 326/38 |
| 5,592,410 A | 1/1997 | Verhaeghe et al. | 365/145 |
| 5,742,548 A | 4/1998 | Ivon Bahout et al. | 365/201 |
| 6,041,002 A | * 3/2000 | Meajima | 365/201 |
| 6,421,273 B1 | * 7/2002 | Ullrich | 365/185.05 |

FOREIGN PATENT DOCUMENTS

DE 43 28 605 A1 3/1994

* cited by examiner

*Primary Examiner*—Albert Decady
*Assistant Examiner*—Joseph D. Torres
(74) *Attorney, Agent, or Firm*—Laurence A. Greenberg; Werner H. Stemer; Gregory L. Mayback

(57) ABSTRACT

Before a write and/or read access to one of the memory cells is carried out, a security information stored in a security memory cell is read out. If the security information is characterized by a first logic state an error signal is generated. If the read-out security information is characterized by a second logic state the memory cell is accessed and a write access is carried out to the security memory cell during which a new security information to be he stored having the second logic state is written to the cell.

7 Claims, 2 Drawing Sheets

OPERATING METHOD FOR AN INTEGRATED MEMORY HAVING WRITEABLE MEMORY CELLS AND CORRESPONDING INTEGRATED MEMORY

CROSS-REFERENCE TO RELATED APPLICATION

This application is a continuation of copending International Application No. PCT/DE00/00654, filed Mar. 2, 2000, which designated the United States.

BACKGROUND OF THE INVENTION

Field of the Invention

The invention relates to an operating method for an integrated memory having writeable memory cells and also to a corresponding integrated memory.

Known integrated memories having writeable memory cells are, for example, dynamic random access memories (DRAMs) and FRAMs or FeRAMs (Ferroelectric RAMs). These two types of memories in each case have memory cells with at least one storage capacitor, which serves for storing data. Memory cells of the one-transistor/one-capacitor type are generally customary in the case of DRAMs. Memory cells of FRAMs may likewise be of the one-transistor/one-capacitor type. They differ from the memory cells of a DRAM in that their storage capacitor has a ferroelectric dielectric. Different logic states of a datum to be stored can be distinguished by a different polarization of the ferroelectric dielectric, since the capacitance of the capacitor changes with its polarization.

U.S. Pat. No. 5,592,410 describes an FRAM having memory cells of the two-transistor/two-capacitor type. In this memory, too, the two storage capacitors of each memory cell have a ferroelectric dielectric.

SUMMARY OF THE INVENTION

It is accordingly an object of the invention to provide an operating method for an integrated memory having writeable memory cells and a corresponding integrated memory, which ascertains whether a functional disturbance occurred during a previous operation of the memory.

With the foregoing and other objects in view there is provided, in accordance with the invention, an operating method for an integrated memory having a writeable security memory cell for storing a security information item, word lines, bit lines crossing over the word lines, and writeable memory cells for storing data and disposed at crossover points between the word lines and the bit lines. The method includes performing the below described steps in an event of a write/read access. The security information item stored in the writeable security memory cell is read out before performing a write/read access to a respective memory cell of the writeable memory cells. An error signal is generated if the security information item read out has a first logic state. An access to the respective memory cell is carried out if the security information item read out has a second logic state. A write access to the writeable security memory cell is performed, in which a new security information item to be stored, which has the second logic state, is fed to the writeable security memory cell.

According to the invention, the integrated memory has the security memory cell which is likewise read in the event of an access to one of the normal memory cells. If the reading-out of the security information item stored in the security memory cell reveals that the logic state of the security information item does not correspond to that logic state with which the security information item should previously have been written to the security memory cell, a corresponding error signal is generated. The error signal then indicates that the storage of the security information item with a known second logic state did not take place correctly. Since the functional disturbance of the memory could also have affected the storage of the datum currently to be read out from the memory cell, the error signal is suitable as a corresponding warning to the operator of the integrated memory.

If no functional disturbance of the memory is detected during the reading of the security memory cell, in other words if the security information item has the second logic state, a new security information item to be stored, having the second logic state, is fed to the security memory cell. Provided that a functional disturbance does not occur in the process, the security information item is written correctly with the second logic state to the security memory cell. On the other hand, if a functional disturbance does occur, the security information item written in does not have the second logic state, but rather the first. If the operating method according to the invention is then carried out again at a later point in time, the functional disturbance will be detected, as already described above, and the error signal generated.

The method described can be carried out during any memory cell access. In order, however, to minimize the time required for carrying out the operating method according to the invention, it is expedient for the method only to be carried out each time the memory is initialized. It is then carried out, for example, only during the first reading-out from one of the memory cells. It can thus be ascertained whether a functional disturbance occurred during the operation of the memory that was effected before the initialization of the memory.

It is favorable if the security memory cell and the memory cells of the memory have the same construction. It is then ensured that functional disturbances of the memory have the same effect both in the event of a write access to the security memory cell and in the event of a write access to one of the memory cells.

It is advantageous, moreover, if, after the security information item has been read from the security memory cell and before the new security information item has been written in, a datum of the first logic state is generated in the security memory cell. This ensures that, even in the case of a memory whose memory contents are not destroyed during reading, a datum of the second logic state is stored in the security memory cell only when the new security information item of the second logic state is written correctly.

With the foregoing and other objects in view there is further provided, in accordance with the invention, an integrated memory. The integrated memory contains writeable memory cells for storing data, a writeable security memory cell for storing a security information item, and a control unit controlling accesses to the writeable memory cells and the writeable security memory cell for reading out the security information item stored in the writeable security memory cell if a write/read access is to be made to one of the writeable memory cells. A checking unit is provided for checking the security information item read from the writeable security memory cell and for generating an error signal if the security information item read out has a first logic state. The checking unit is connected to the control unit. The control unit serves for carrying out a write access to the writeable security memory cell, which follows the reading-out of the security information item and during which the control unit feeds to the writeable security memory cell a new security information item to be stored, having a second logic state, if no error signal was previously generated by the checking unit.

In this case, it is favorable if the security memory cell is already configured in such a way that its memory content is destroyed in the event of a read access, with the result that it contains a datum of the first logic state after the read access, irrespective of the previously stored datum. This automatically has the effect that a datum of the first logic state is stored in the security memory cell after the read access. Thus, such a datum does not have to be specially fed to the security memory cell in this case. All memories in which destructive reading takes place, such as, e.g. DRAMs and FRAMS, are suitable for this purpose.

In accordance with a concomitant feature of the invention, the writeable security memory cell is a ferroelectric memory cell. In addition, the writeable security memory cell and the writeable memory cells are identical.

Other features which are considered as characteristic for the invention are set forth in the appended claims.

Although the invention is illustrated and described herein as embodied in an operating method for an integrated memory having writeable memory cells and a corresponding integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
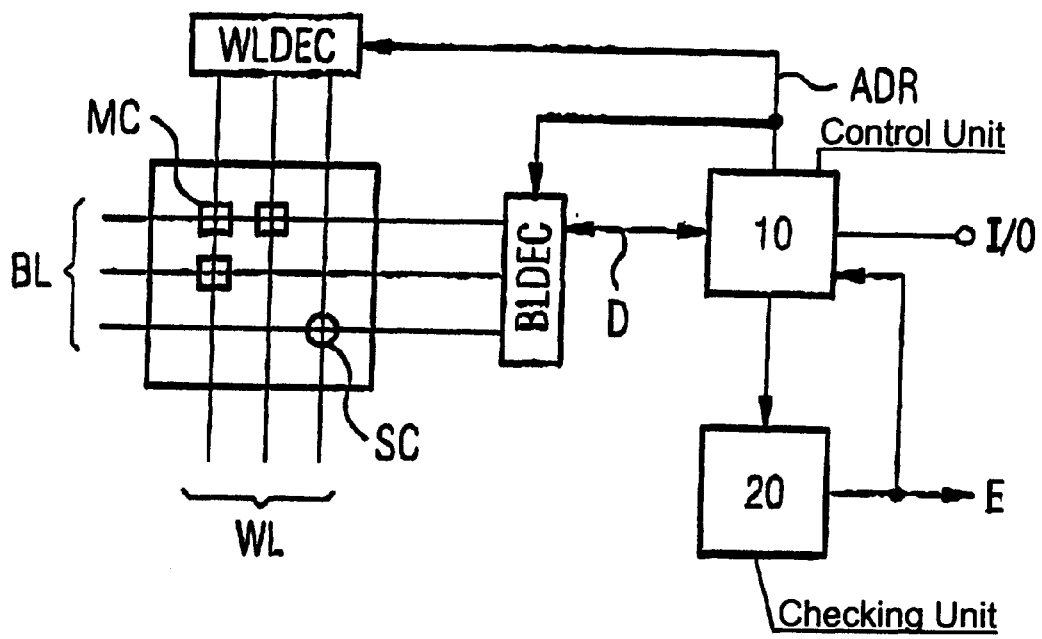
FIG. 2 is a block diagram of an exemplary embodiment of an integrated memory according to the invention.

Referring now to the figures of the drawing in detail and first, particularly, to FIG. 2 thereof, there is shown a ferroelectric memory of the FRAM type having writeable memory cells MC and a writeable security memory cell SC, which are in each case disposed at crossover points between bit lines BL and word lines WL.

Figure 3:
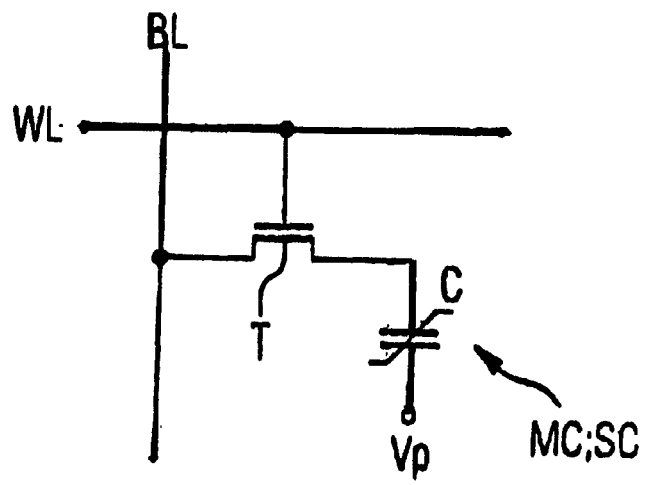
FIG. 3 is a circuit diagram showing the construction of a memory cell and of a security memory cell of the integrated memory shown in FIG. 2.

The memory cells MC and the security memory cell SC have the construction shown in FIG. 3. They have a selection transistor T and a storage capacitor C with a ferroelectric dielectric. One electrode of the storage capacitor C is connected to a plate potential $V_P$ of a cell plate of the memory. The other electrode of the storage capacitor C is connected to one of the bit lines BL through the selection transistor T. A gate of the selection transistor T is connected to one of the word lines WL. In this exemplary embodiment, the plate potential $V_P$ has a value which corresponds to the arithmetic mean of two supply potentials of the memory.

In order to write a logic zero, the bit line BL is brought to a low supply potential (e.g. 0 volts). The selection M transistor T is subsequently turned on via the word line WL, with the result that the polarization of the ferroelectric dielectric within the storage capacitor C and hence its capacitance assumes a first value. In order to write a logic one, the potential of the bit line BL is brought to the higher supply potential, as a result of which the polarization of the dielectric and the capacitance thereof assumes a second value. As long as no access is made to the memory cell MC, the selection transistor T is turned off and the bit line BL is at the plate potential $V_P$. In this state, there is no voltage across the storage capacitor C, with the result that the latter maintains its polarization unchanged.

In order to read out a datum stored in the memory cell MC, the bit line BL is brought to the low supply potential (zero volts). After the selection transistor T has been turned on, the magnitude by which the potential of the precharged bit line BL changes is observed. This is because the different polarization states of the storage capacitor, which correspond to the different logic states, in each case result in a different value of the capacitance of the storage capacitor C. If its capacitance is large, the potential of the bit line BL changes to a greater extent than if its capacitance is smaller. Since the bit line BL was precharged to the value of the low supply potential during reading-out, afterward a logic zero is always stored in the memory cell MC, irrespective of the datum previously stored therein. Thus, read accesses that destroy the memory cell content ("destructive read") are involved in the case of the memory.

In accordance with FIG. 2, the word lines WL are driven via a word line decoder WLDEC and the bit lines BL via a bit line decoder BLDEC. The decoders each select one of the word lines WL and one of the bit lines BL, depending on addresses ADR fed to them.

The memory furthermore has a control unit 10 and a checking unit 20. The control unit 10 serves for reading out a security information item stored in the security memory cell SC in the event of a write and/or read access to be made to one of the memory cells MC. It is connected to the bit line decoder BLDEC via a data line D, via which data can be transferred from and to one of the memory cells MC or a security information item can be transferred from or to the security memory cell SC. For the addressing of the corresponding memory cell MC or of the security memory cell SC, the control unit 10 communicates the addresses ADR to the two decoders WLDEC or BLDEC. The control unit 10 is connected to an input/output I/O, from which it receives data to be written to one of the memory cells MC, or to which it outputs data read from one of the memory cells MC.

The checking unit 20 is connected to the control unit 10 and serves for checking the security information item read from the security memory cell SC and for generating an error signal E if the security information item read out is a logic zero. The checking unit 20 outputs an error signal E to a point outside the memory. Moreover, it communicates the error signal E back to the control unit 10, which is deactivated by the error signal E. Afterward, data transfer via the input/output I/O from or to the memory is not possible. If the security information item that is stored in the security memory cell SC and is read out is a logic one, the error signal E is not generated and the control unit 10 continues to perform the accesses to the memory cells MC.

Figure 1:
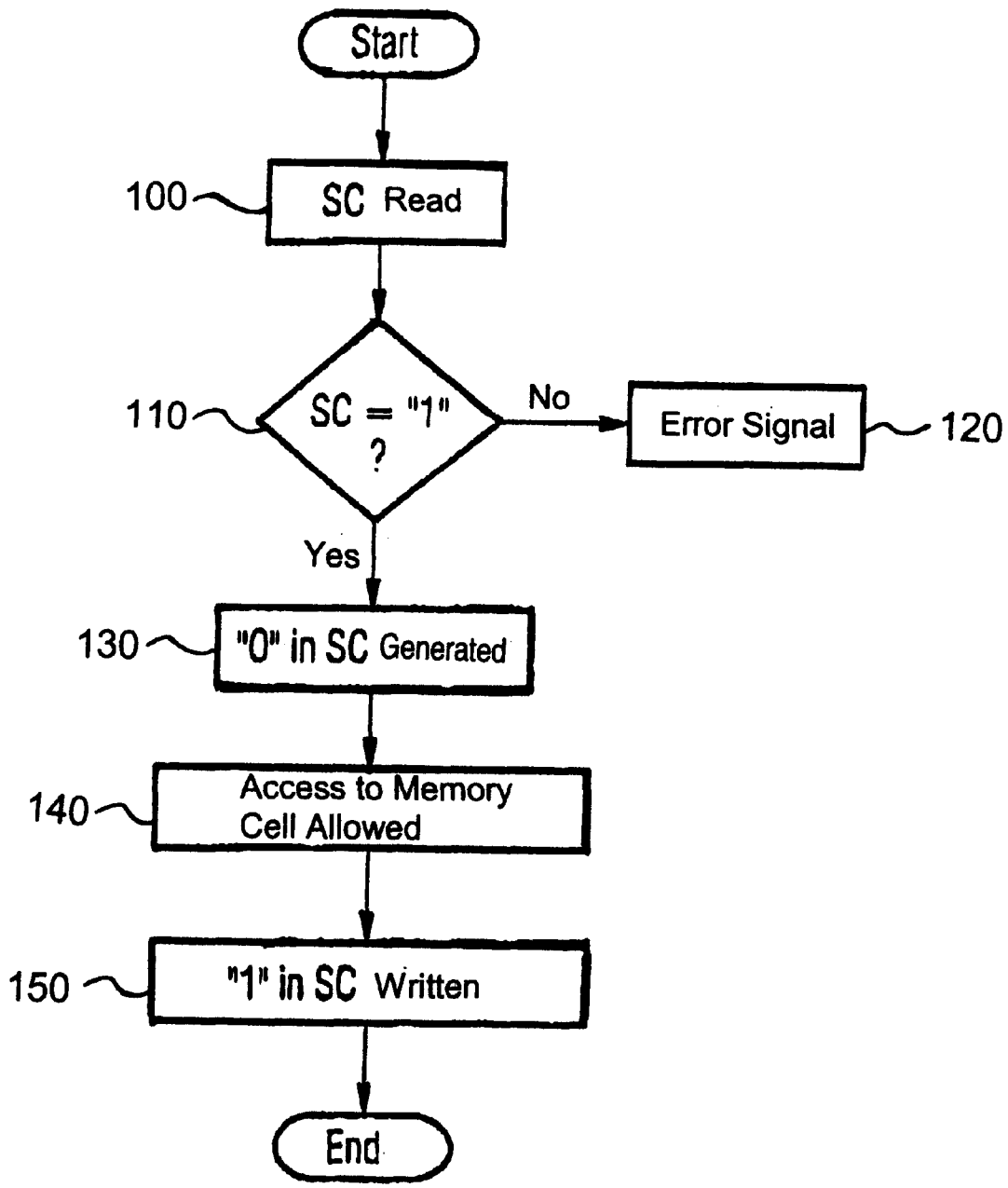
FIG. 1 is a flow diagram of an operating method according to the invention.

The operating method according to the invention is explained below with reference to FIG. 1. In the event of a write and/or read access to be made to one of the memory cells MC, first a read access is made to the security memory cell SC, step 100. In this case, the checking unit 20 checks whether the security information item read out is a logic one, step 110. If this is not the case, the error signal E is generated and the control unit 10 is deactivated, step 120. In the opposite case, a logic zero is generated in the security memory cell SC, step 130. In the exemplary embodiment discussed here, as already explained with reference to FIG. 3, this is done automatically in the event of each read access to the security memory cell SC. Therefore the logic zero has already been generated in the security memory cell SC as a result of the reading-out of the security information item from the security memory cell SC. In the next step 140, the desired access to the memory cell MC is carried out. Afterward, a logic one is written to the security memory cell SC, step 150.

Since, as the last step of the operating method, a logic one is fed to the security memory cell SC as a new security information item to be stored, the generation of the error signal E the next time the method is carried out indicates that this logic one was not stored correctly in the security memory cell SC on account of a functional disturbance of the memory. The error signal E makes the operator of the memory aware of this malfunction, since it cannot be precluded that the malfunction has also affected the storage of data in the normal memory cells MC.

The method explained with reference to FIG. 1 can be carried out each time one of the memory cells MC is accessed or only after an initialization of the memory.

In other exemplary embodiments of the invention, it is also possible that the error signal E generated by the checking unit 20 only results in deactivation of the control unit 10 and the error signal E is not communicated to a point outside the memory. Equally, exemplary embodiments are possible in which the error signal E is only communicated to a point outside the memory, but does not serve to deactivate the control unit 10.

Since, as explained with reference to FIG. 3, when the memory cells MC are read, their memory content is destroyed in principle by a logic zero being generated in the memory cell MC, it is necessary, after the reading-out, to write the information read out—if appropriate amplified—back to the memory cell. The writing-back process is known not only from FRAMs but also from DRAMs. In this case, the writing-back process, which is carried out during a read access, does not differ from a write access to the memory cell. Since functional disturbances can again occur in this case as well, it is expedient to carry out the operating method according to the invention not only purely in the event of write accesses to the memory cells MC but also in the event of read accesses. The functional disturbances of the memory that are detected by the checking unit 20 may have been initiated for example on account of undesired external manipulations of the memory. Therefore, the application of the invention is expedient in particular in security-relevant memories, as are used for example in smart cards.

Whereas only one security memory cell SC is provided for the entire memory in the exemplary embodiment presented here, other exemplary embodiments are possible in which the memory cells MC are divided into groups which are each assigned a security memory cell SC of the type described. By way of example, it is possible to provide a security memory cell SC per memory block.

In the event of failure of the voltage supply of the memory, the security memory cell SC is not written to properly at the end of a write and/or read access. In that case, too, the error signal E is generated in the manner according to the invention if a logic zero was previously generated in the security memory cell SC. The logic zero can be generated either by a destructive read access or by direct writing in the security memory cell.

We claim:

1. An operating method for an integrated memory having a writeable security memory cell for storing a security information item, word lines, bit lines crossing over the word lines, and writeable memory cells for storing data and disposed at crossover points between the word lines and the bit lines, which comprises performing the following steps in an event of a write/read access:

reading out the security information item stored in the writeable security memory cell before performing the write/read access to a respective memory cell of the writeable memory cells;

generating an error signal if the security information item read out has a first logic state;

carrying out an access to the respective memory cell if the security information item read out has a second logic state; and performing a write access to the writeable security memory cell, in which a new security information item to be stored, which has the second logic state, is fed to the writeable security memory cell.

2. The operating method according to claim 1, which comprises carrying out the steps of claim 1 each time the integrated memory is initialized.

3. The operating method according to claim 1, which comprises generating a datum of the first logic state in the writeable security memory cell after the security information item has been read from the writeable security memory cell and before the new security information item has been written in.

4. An integrated memory, comprising:

writeable memory cells for storing data;

a writeable security memory cell for storing a security information item;

a control unit controlling accesses to said writeable memory cells and said writeable security memory cell for reading out the security information item stored in said writeable security memory cell if a write/read access is to be made to one of said writeable memory cells; and a checking unit for checking the security information item read from said writeable security memory cell and for generating an error signal if the security information item read out has a first logic state, said checking unit connected to said control unit;

said control unit serves for carrying out a write access to said writeable security memory cell, which follows the reading-out of the security information item and during which said control unit feeds to said writeable security memory cell a new security information item to be stored, having a second logic state, if no error signal was previously generated by said checking unit.

5. The integrated memory according to claim 4, wherein said writeable security memory cell is configured such that its memory content is destroyed in an event of a read access, with a result that said writeable security memory cell contains a datum of the first logic state after the read access, irrespective of a previously stored datum.

6. The integrated memory according to claim 5, wherein said writeable security memory cell is a ferroelectric memory cell.

7. The integrated memory according to claim 4, wherein said writeable security memory cell and said writeable memory cells have an identical construction.

* * * * *